(12) United States Patent
Cheng et al.

(10) Patent No.: US 10,446,664 B1
(45) Date of Patent: Oct. 15, 2019

(54) INNER SPACER FORMATION AND CONTACT RESISTANCE REDUCTION IN NANOSHEET TRANSISTORS

(71) Applicant: International Business Machines Corporation, Armonk, NY (US)

(72) Inventors: Kangguo Cheng, Schenectady, NY (US); Choonghyun Lee, Rensselaer, NY (US); Juntao Li, Cohoes, NY (US); Peng Xu, Santa Clara, CA (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/926,664

(22) Filed: Mar. 20, 2018

(51) Int. Cl.
| | |
|---|---|
| *H01L 29/66* | (2006.01) |
| *H01L 29/06* | (2006.01) |
| *H01L 29/08* | (2006.01) |
| *H01L 29/78* | (2006.01) |
| *H01L 21/02* | (2006.01) |
| *H01L 21/225* | (2006.01) |

(52) U.S. Cl.
CPC .... *H01L 29/66553* (2013.01); *H01L 29/0653* (2013.01); *H01L 29/0673* (2013.01); *H01L 29/0847* (2013.01); *H01L 29/6653* (2013.01); *H01L 29/6681* (2013.01); *H01L 29/66545* (2013.01); *H01L 29/7853* (2013.01); *H01L 21/02164* (2013.01); *H01L 21/02236* (2013.01); *H01L 21/02255* (2013.01); *H01L 21/2255* (2013.01)

(58) Field of Classification Search
CPC .......... H01L 29/66553; H01L 29/0653; H01L 29/66545; H01L 29/0847; H01L 29/6681
See application file for complete search history.

(56) References Cited

U.S. PATENT DOCUMENTS

| | | | |
|---|---|---|---|
| 7,999,251 B2 | 8/2011 | Chu et al. | |
| 8,753,942 B2 | 6/2014 | Kuhn et al. | |
| 8,778,768 B1 * | 7/2014 | Chang ............... | H01L 29/42392 257/213 |
| 9,496,338 B2 | 11/2016 | Chang et al. | |
| 9,647,139 B2 | 5/2017 | Doris et al. | |

(Continued)

OTHER PUBLICATIONS

Fang et al., "Vertically Stacked SiGe Nanowire Array Channel CMOS Transistors," IEEE Electron Device Letters vol. 28, No. 3, Mar. 2007, pp. 211-213.

(Continued)

*Primary Examiner* — Kyoung Lee
*Assistant Examiner* — Christina A Sylvia
(74) *Attorney, Agent, or Firm* — Cantor Colburn LLP; Vazken Alexanian

(57) ABSTRACT

Embodiments of the invention are directed to a method of fabricating a semiconductor device. A non-limiting example of the method includes performing fabrication operations to form a nanosheet field effect transistor device, wherein the fabrication operations include forming a stack over a substrate. The stack includes alternating layers of sacrificial nanosheets and channel nanosheets over a substrate. The stack further includes lateral sidewalls having a length (L) and end sidewalls having a width (W), wherein L is greater than W. Source or drain (S/D) regions are formed along the length (L) of the lateral sidewalls.

18 Claims, 11 Drawing Sheets

ACROSS-GATE, THROUGH FIN

(56) References Cited

U.S. PATENT DOCUMENTS

| | | | |
|---|---|---|---|
| 9,773,865 B2 | 9/2017 | Chan et al. | |
| 2004/0063286 A1* | 4/2004 | Kim | H01L 21/823412 |
| | | | 438/283 |
| 2016/0365411 A1* | 12/2016 | Yeh | H01L 29/0673 |
| 2017/0005180 A1 | 1/2017 | Cheng et al. | |
| 2017/0059892 A1* | 3/2017 | Jain | G02F 1/01708 |
| 2017/0213888 A1 | 7/2017 | Chang et al. | |

OTHER PUBLICATIONS

Loubet et al., "Stacked Nanosheet Gate-All-Around Transistor to Enable Scaling Beyond FinFET", 2017 Symposium on VLSI Technology Digest of Technical Papers, pp. T230-T231.

* cited by examiner

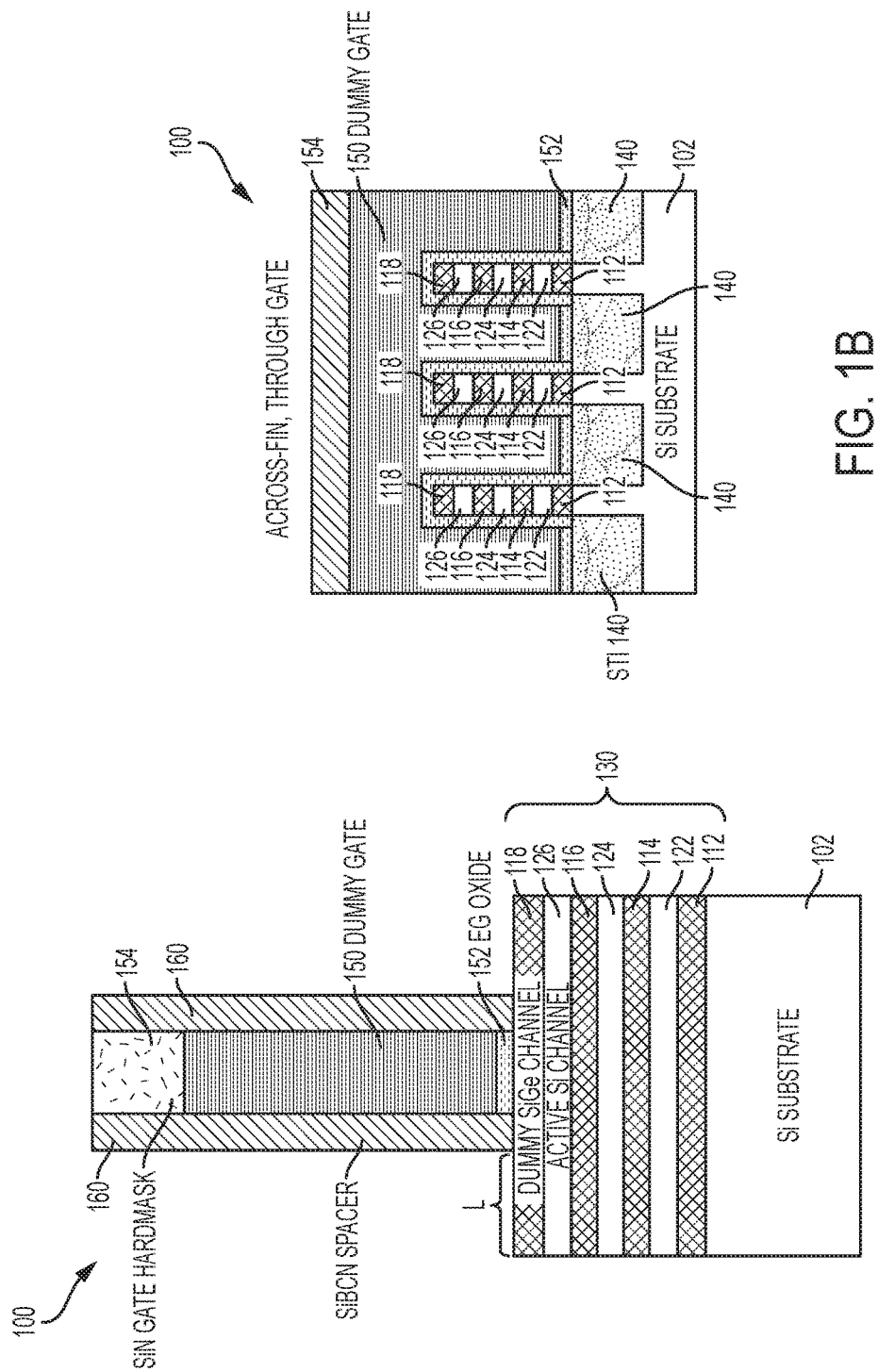

ACROSS-GATE, THROUGH FIN

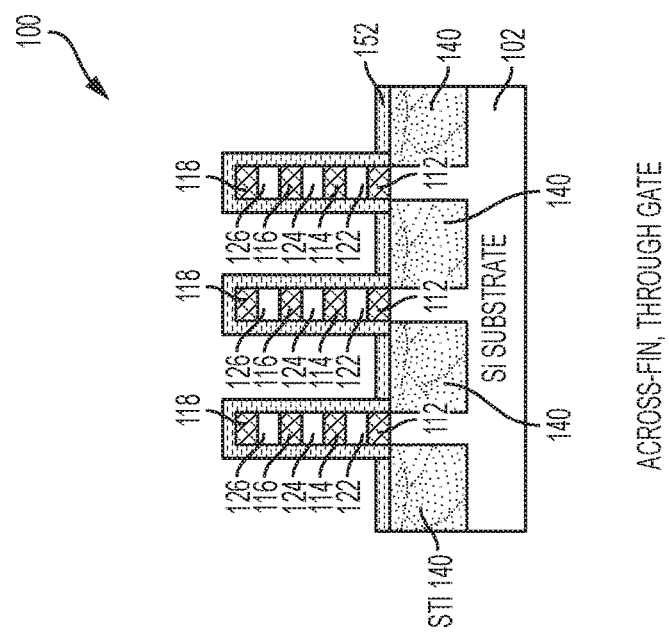
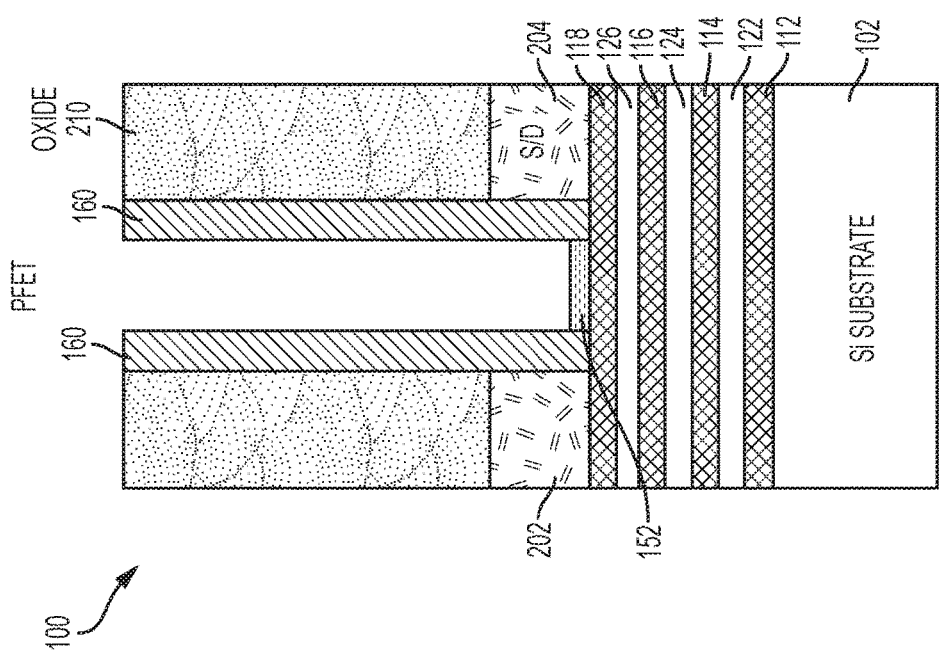

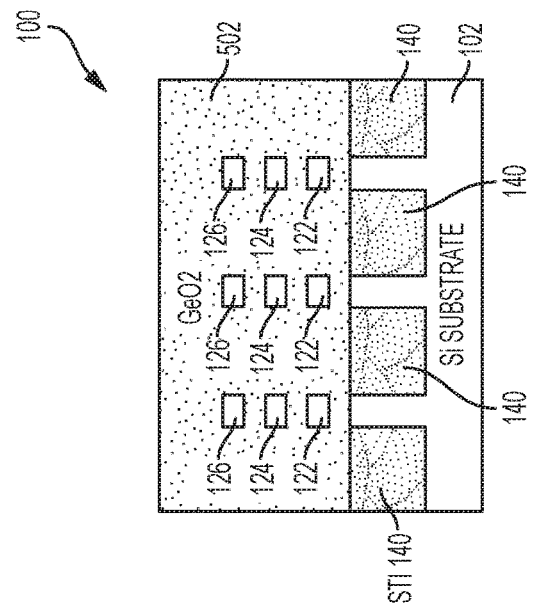
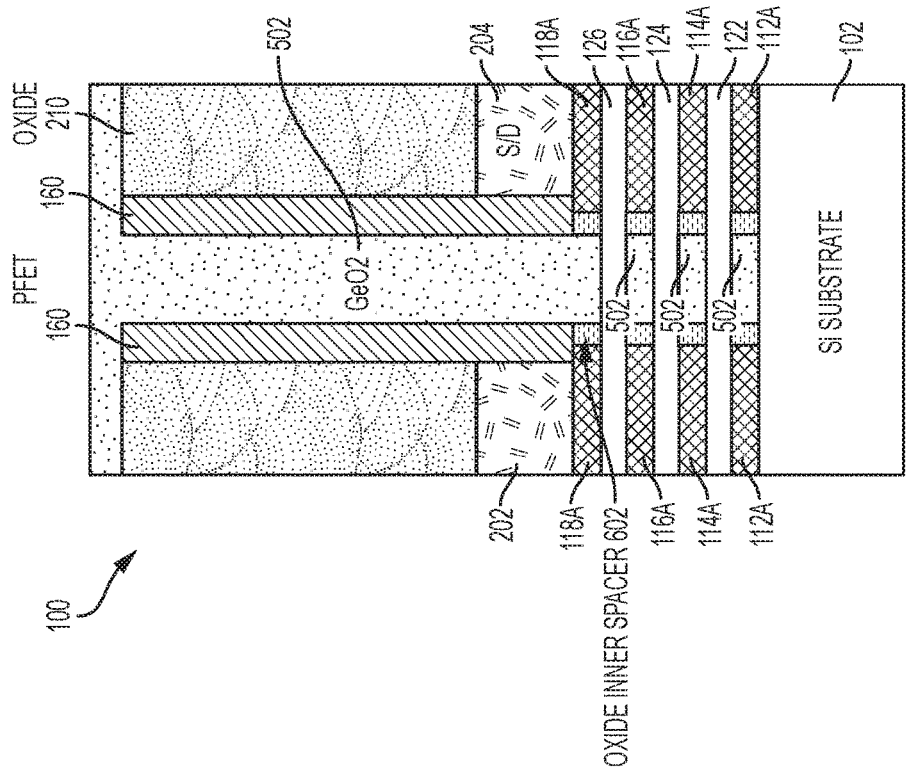
FIG. 6B ACROSS-FIN, THROUGH GATE
FIG. 6A ACROSS-GATE, THROUGH FIN

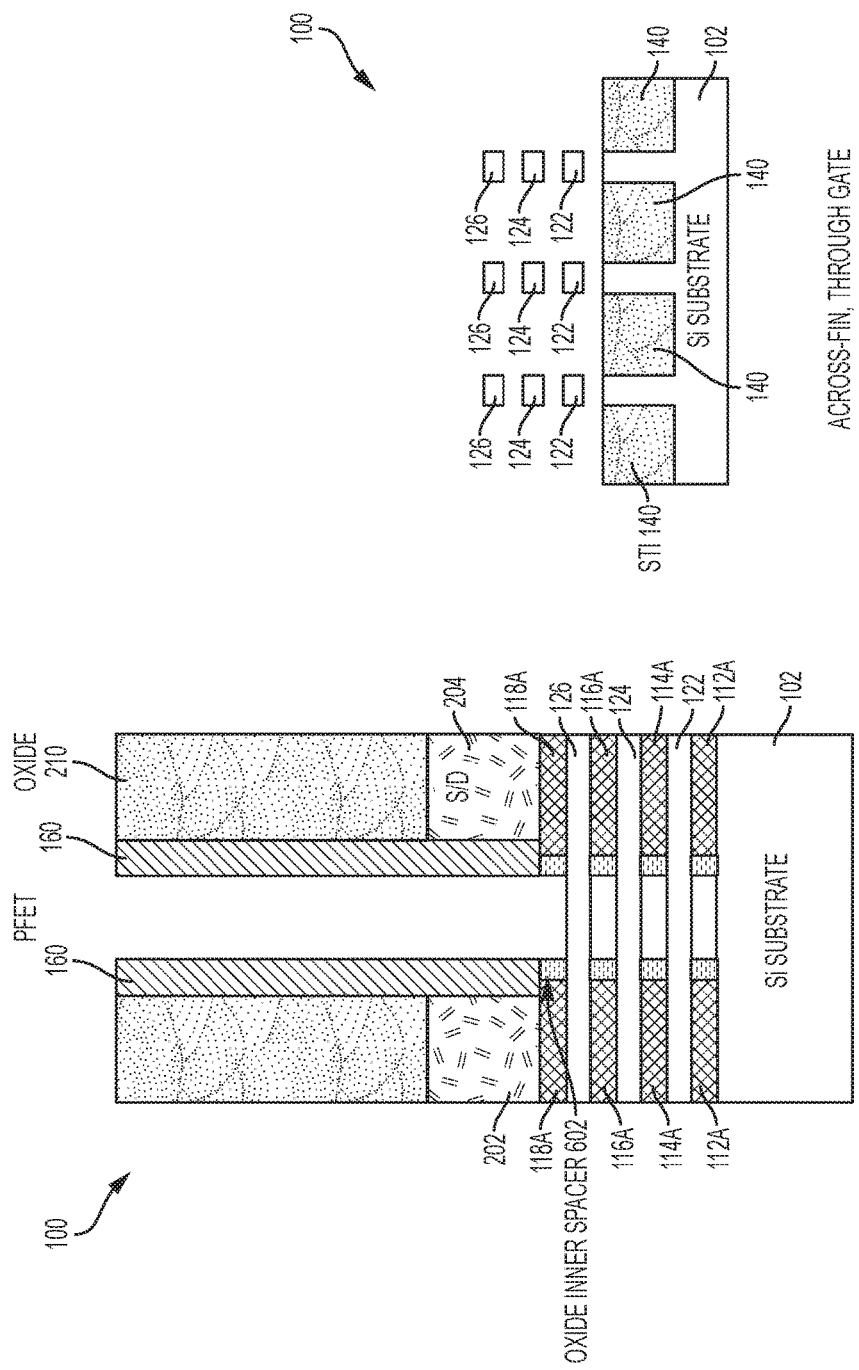

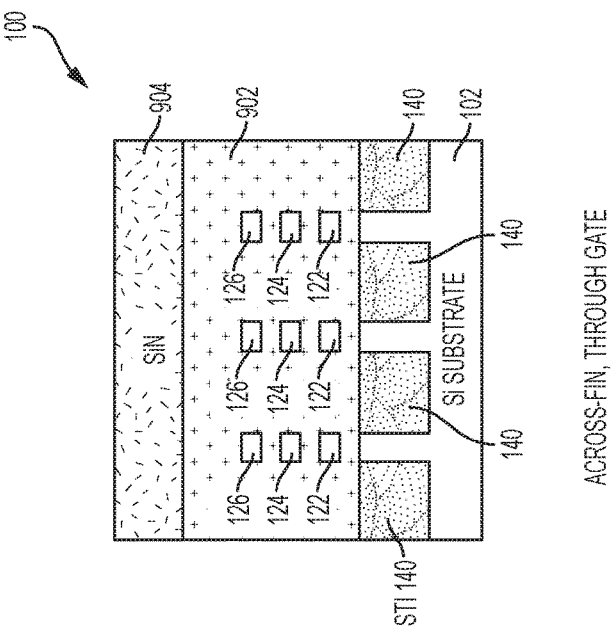
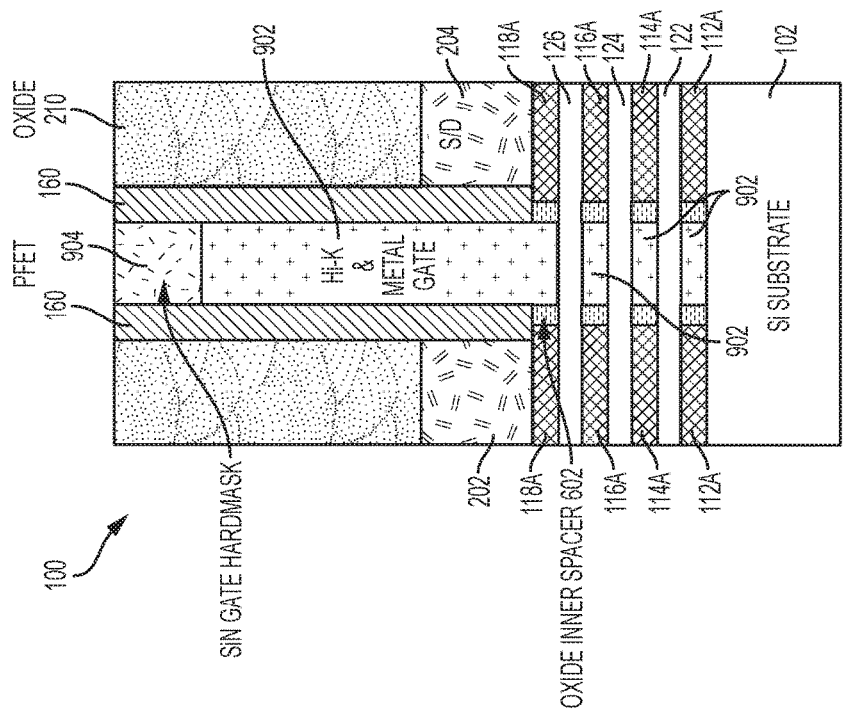
FIG. 9A
FIG. 9B

INNER SPACER FORMATION AND CONTACT RESISTANCE REDUCTION IN NANOSHEET TRANSISTORS

BACKGROUND

The present invention relates in general to fabrication methods and resulting structures for semiconductor devices. More specifically, the present invention relates to fabrication methods and resulting structures for forming inner spacers and reducing contact resistance in vertically stacked nanosheet transistors.

In contemporary semiconductor device fabrication processes, a large number of semiconductor devices, such as silicon channel n-type field effect transistors (nFETs) and silicon germanium channel p-type field effect transistors (pFETs), are fabricated on a single wafer. Non-planar transistor device architectures, such as nanosheet (or nanowire) transistors, can provide increased device density and increased performance over planar transistors. Nanosheet transistors, in contrast to conventional planar FETs, include a gate stack that wraps around the full perimeter of multiple nanosheet channel regions. Nanosheet transistor configurations enable fuller depletion in the nanosheet channel regions and reduce short-channel effects.

SUMMARY

Embodiments of the invention are directed to a method of fabricating a semiconductor device. A non-limiting example of the method includes performing fabrication operations to form a nanosheet field effect transistor device, wherein the fabrication operations include forming a stack over a substrate. The stack includes alternating layers of sacrificial nanosheets and channel nanosheets over a substrate. The stack further includes lateral sidewalls having a length (L) and end sidewalls having a width (W), wherein L is greater than W. Source or drain (S/D) regions are formed along the length (L) of the lateral sidewalls.

Embodiments of the invention are directed to a method of fabricating a semiconductor device. A non-limiting example of the method includes performing fabrication operations to form a nanosheet field effect transistor device, wherein the fabrication operations include forming a stack over a substrate. The stack includes alternating layers of sacrificial nanosheets and channel nanosheets over a substrate. The stack further includes lateral sidewalls having a length (L) and end sidewalls having a width (W), wherein L is greater than W. The method further includes forming, using an epitaxial growth process, S/D regions along the length (L) of the lateral sidewalls. Inner spacers are formed by performing a chemical reaction that includes converting an oxide of a second type of semiconductor material to an oxide of a first type of semiconductor material.

Embodiments of the invention are further directed to a nanosheet field effect transistor device. A non-limiting example of the device includes a stack formed over a substrate. The stack includes alternating layers of sacrificial nanosheets and channel nanosheets over the substrate. The stack further includes lateral sidewalls having a length (L) and end sidewalls having a width (W), wherein L is greater than W. Source or drain (S/D) regions are epitaxially grown along the length (L) of the lateral sidewalls. Inner spacers are formed adjacent portions of the sacrificial nanosheet layers.

Additional features and advantages are realized through techniques described herein. Other embodiments and aspects are described in detail herein. For a better understanding, refer to the description and to the drawings.

BRIEF DESCRIPTION OF THE DRAWINGS

The subject matter which is regarded as embodiments is particularly pointed out and distinctly claimed in the claims at the conclusion of the specification. The foregoing and other features and advantages of the embodiments are apparent from the following detailed description taken in conjunction with the accompanying drawings in which:

FIGS. 1A-9B depict cross-sectional views of a section of a substrate/wafer after various fabrication operations to form a nanosheet/nanowire transistor thereon according to embodiments of the present invention, in which:

FIG. 1A depicts a cross-sectional view of a semiconductor structure after a fabrication stage according to embodiments of the present invention;

FIG. 1B depicts a cross-sectional view of the semiconductor structure shown in FIG. 1A, wherein the cross-sectional view is taken through a vertical plane extending through the gate structure region shown in FIG. 1A and rotated clockwise by 90 degrees;

FIG. 3A depicts a cross-sectional view of a semiconductor structure after a fabrication stage according to embodiments of the present invention;

FIG. 3B depicts a cross-sectional view of the semiconductor structure shown in FIG. 3A, wherein the cross-sectional view is taken through a vertical plane extending through the gate structure region shown in FIG. 3A and rotated clockwise by 90 degrees;

FIG. 6A depicts a cross-sectional view of a semiconductor structure after a fabrication stage according to embodiments of the present invention;

FIG. 6B depicts a cross-sectional view of the semiconductor structure shown in FIG. 6A, wherein the cross-sectional view is taken through a vertical plane extending through the gate structure region shown in FIG. 6A and rotated clockwise by 90 degrees;

FIG. 7 depicts a diagram illustrating the selective formation of a silicon dioxide layer from an anneal-driven reaction between germanium dioxide and silicon germanium according to embodiments of the invention;

FIG. 8A depicts a cross-sectional view of a semiconductor structure after a fabrication stage according to embodiments of the present invention;

FIG. 8B depicts a cross-sectional view of the semiconductor structure shown in FIG. 8A, wherein the cross-sectional view is taken through a vertical plane extending through the gate structure region shown in FIG. 8A and rotated clockwise by 90 degrees;

FIG. 9A depicts a cross-sectional view of a semiconductor structure after a fabrication stage according to embodiments of the present invention; and FIG. 9B depicts a cross-sectional view of the semiconductor structure shown in FIG. 9A, wherein the cross-sectional view is taken through a vertical plane extending through the gate structure region shown in FIG. 9A and rotated clockwise by 90 degrees.

DETAILED DESCRIPTION

Figure 1C:
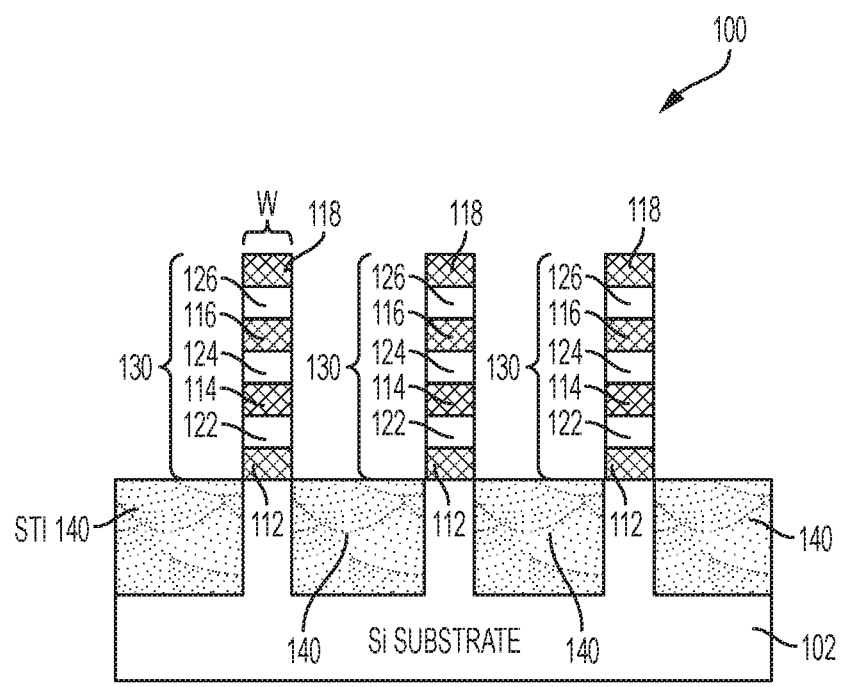
FIG. 1C depicts a cross-sectional view of the semiconductor structure shown in FIG. 1A, wherein the cross-sectional view is taken through a vertical plane extending through a source/drain (S/D) region of the semiconductor structure shown in FIG. 1A and rotated counterclockwise by 90 degrees.

It is understood in advance that although this invention includes a detailed description of exemplary GAA nanosheet FET architectures having silicon (Si) channel nanosheets and SiGe sacrificial nanosheets, embodiments of the invention are not limited to the particular FET architectures or materials described in this specification. Rather, embodiments of the present invention are capable of being implemented in conjunction with any other type of nanosheet/nanowire FET architecture or materials now known or later developed. In this detailed description and in the claims, the terms nanosheet and nanowire are treated as being synonymous.

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Turning now to a description of technologies that are more specifically relevant to the present invention, transistors are semiconductor devices commonly found in a wide variety of ICs. A transistor is essentially a switch. When a voltage is applied to a gate of the transistor that is greater than a threshold voltage, the switch is turned on, and current flows through the transistor. When the voltage at the gate is less than the threshold voltage, the switch is off, and current does not flow through the transistor.

Typical semiconductor devices are formed using active regions of a wafer. The active regions are defined by isolation regions used to separate and electrically isolate adjacent semiconductor devices. For example, in an integrated circuit having a plurality of metal oxide semiconductor field effect transistors (MOSFETs), each MOSFET has a source and a drain that are formed in an active region of a semiconductor layer by implanting n-type or p-type impurities in the layer of semiconductor material. Disposed between the source and the drain is a channel (or body) region. Disposed above the body region is a gate electrode. The gate electrode and the body are spaced apart by a gate dielectric layer. Complementary metal oxide semiconductor (CMOS) is a technology that uses complementary and symmetrical pairs of p-type and n-type MOSFETs to implement logic functions. The channel region connects the source and the drain, and electrical current flows through the channel region from the source to the drain. The electrical current flow is induced in the channel region by a voltage applied at the gate electrode.

The wafer footprint of an FET is related to the electrical conductivity of the channel material. If the channel material has a relatively high conductivity, the FET can be made with a correspondingly smaller wafer footprint. A known method of increasing channel conductivity and decreasing FET size is to form the channel as a nanostructure. For example, a so-called gate-all-around (GAA) nanosheet FET is a known architecture for providing a relatively small FET footprint by forming the channel region as a series of nano sheets. In a known GAA configuration, a nanosheet-based FET includes a source region, a drain region and stacked nanosheet channels between the source and drain regions. A gate surrounds the stacked nanosheet channels and regulates electron flow through the nanosheet channels between the source and drain regions. GAA nanosheet FETs are fabricated by forming alternating layers of channel nanosheets and sacrificial nanosheets. The sacrificial nanosheets are released from the channel nanosheets before the FET device is finalized. For n-type FETs, the channel nanosheets are typically silicon (Si) and the sacrificial nanosheets are typically silicon germanium (SiGe). For p-type FETs, the channel nanosheets are typically SiGe and the sacrificial nanosheets are typically Si. In some implementations, the channel nanosheet of a p-FET can be SiGe or Si, and the sacrificial nanosheets can be Si or SiGe. Forming the GAA nanosheets from alternating layers of channel nanosheets formed from a first type of semiconductor material (e.g., Si for n-type FETs, and SiGe for p-type FETs) and sacrificial nanosheets formed from a second type of semiconductor material (e.g., SiGe for n-type FETs, and Si for p-type FETs) provides superior channel electrostatics control, which is necessary for continuously scaling gate lengths down to seven (7) nanometer CMOS technology and below. The use of multiple layered SiGe/Si sacrificial/channel nanosheets (or Si/SiGe sacrificial/channel nanosheets) to form the channel regions in GAA FET semiconductor devices provides desirable device characteristics, including the introduction of strain at the interface between SiGe and Si.

Although nanosheet channel FET architectures provide increased device density over planar FET architectures, there are still challenges when attempting to fabricate nanosheet channel FETs that provide the performance characteristics required for a particular application. For example, in known nanosheet FET fabrication processes, the elongated fin-shaped columns formed from alternating layers of Si channel nanosheets and SiGe sacrificial nanosheets are chopped into smaller fin-shaped columns in order to form inner spacers at the end regions of the SiGe sacrificial nanosheets. The procedure for forming the inner spacers leaves only a limited cross-section surface at the ends of the chopped Si channel nanosheets from which to epitaxially grow the S/D regions. The quality of an epitaxial growth is related to the surface area from which the epitaxial growth occurs. Because known nanosheet fabrication processes leave only limited single crystalline surface areas available for epitaxially growing the S/D regions, it can be difficult to form high quality epitaxially grown S/D regions using known nanosheet fabrication methods.

Turning now to an overview of aspects of the invention, embodiments of the invention provide fabrication methods and resulting structures for forming inner spacers and reducing contact resistance in vertically stacked nanosheet transistors. In embodiments of the invention, $GeO_2$ is used to form self-aligned inner spacers without the need to cut the elongated fin-shaped columns formed from alternating layers of Si channel nanosheets and SiGe sacrificial nanosheets. The elongated fin-shaped columns formed from alternating layers of Si channel nanosheets and SiGe sacrificial nanosheets provide substantially more exposed Si channel surface area. Accordingly, in embodiments of the invention, high quality, low contact resistance S/D regions can be epitaxially grown from the uncut elongated fin-shaped columns formed from alternating layers of Si channel nanosheets and SiGe sacrificial nanosheets.

Turning now to a more detailed description of aspects of the invention, FIGS. 1A-9B depict cross-sectional views of a semiconductor structure 100 on a substrate/wafer 102 after various fabrication operations to form a nanosheet/nanowire transistor thereon according to embodiments of the present invention. FIG. 1A depicts a cross-sectional view (i.e., looking across the dummy gate 150 and through the fin 130) of the semiconductor structure 100 after an initial set of fabrication operations according to embodiments of the present invention. FIG. 1B depicts a cross-sectional view of the semiconductor structure 100 shown in FIG. 1A, wherein the FIG. 1B cross-sectional view (i.e., looking across the fins 130 and through the dummy gate 150) is taken through a vertical plane extending through the gate structure region shown in FIG. 1A and rotated clockwise by 90 degrees. FIG. 1C depicts a cross-sectional view of the semiconductor structure 100 shown in FIG. 1A, wherein the cross-sectional view (i.e., looking across the fins 130 and through the S/D region 204 (shown in FIG. 2A)) is taken through a vertical plane extending through the S/D region 204 of the semiconductor structure 100 shown in FIG. 1A and rotated counterclockwise by 90 degrees.

The fabrication operations used to form the semiconductor structure 100 shown in FIG. 1A includes forming an alternating series of SiGe dummy/sacrificial nanosheet layers 112, 114, 116, 118 and Si nanosheet layers 122, 124, 126 in a stack on the Si substrate 102. In some embodiments of the invention, the SiGe nanosheet layers 112, 114, 116, 118 can be SiGe 25%. The notation "SiGe 25%" is used to indicate that 25% of the SiGe material is Ge.

In embodiments of the invention, the alternating series of SiGe dummy/sacrificial nanosheet layers 112, 114, 116, 118 and Si nanosheet layers 122, 124, 126 can be formed by epitaxially growing one layer and then the next until the desired number and desired thicknesses of the nanosheet layers are achieved. Epitaxial materials can be grown from gaseous or liquid precursors. Epitaxial materials can be grown using vapor-phase epitaxy (VPE), molecular-beam epitaxy (MBE), liquid-phase epitaxy (LPE), or other suitable process. Epitaxial silicon, silicon germanium, and/or carbon doped silicon (Si:C) can be doped during deposition (in-situ doped) by adding dopants, n-type dopants (e.g., phosphorus or arsenic) or p-type dopants (e.g., boron or gallium), depending on the type of transistor.

The terms "epitaxial growth and/or deposition" and "epitaxially formed and/or grown" mean the growth of a semiconductor material (crystalline material) on a deposition surface of another semiconductor material (crystalline material), in which the semiconductor material being grown (crystalline overlayer) has substantially the same crystalline characteristics as the semiconductor material of the deposition surface (seed material). In an epitaxial deposition process, the chemical reactants provided by the source gases are controlled and the system parameters are set so that the depositing atoms arrive at the deposition surface of the semiconductor substrate with sufficient energy to move about on the surface such that the depositing atoms orient themselves to the crystal arrangement of the atoms of the deposition surface. Therefore, an epitaxially grown semiconductor material has substantially the same crystalline characteristics as the deposition surface on which the epitaxially grown material is formed. For example, an epitaxially grown semiconductor material deposited on a $\{100\}$ orientated crystalline surface will take on a $\{100\}$ orientation. In some embodiments, epitaxial growth and/or deposition processes are selective to forming on semiconductor surfaces, and generally do not deposit material on exposed surfaces, such as silicon dioxide or silicon nitride surfaces.

In some embodiments, the gas source for the deposition of epitaxial semiconductor material include a silicon containing gas source, a germanium containing gas source, or a combination thereof. For example, an epitaxial silicon layer can be deposited from a silicon gas source that is selected from the group consisting of silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane and combinations thereof. An epitaxial germanium layer can be deposited from a germanium gas source that is selected from the group consisting of germane, digermane, halogermane, dichlorogermane, trichlorogermane, tetrachlorogermane and combinations thereof. While an epitaxial silicon germanium alloy layer can be formed utilizing a combination of such gas sources. Carrier gases like hydrogen, nitrogen, helium and argon can be used.

As best shown in FIG. 1C, known semiconductor fabrication operations have been used to etch or recess the alternating nanosheet layers 112, 122, 114, 124, 116, 126, 118 to form multiple elongated fin-shaped columns 130. In an example fabrication process, a patterned hard mask (not shown) is deposited over the alternating nanosheet layers 112, 122, 114, 124, 116, 126, 118. The pattern of the hard mask defines the footprints of the multiple elongated columns 130. An etch (e.g., an RIE) or a recess can be applied to remove the portions of the alternating nanosheet layers that are not covered by the patterned hard mask, thereby forming the intermediate elongated columns 130 formed from alternating series of SiGe dummy/sacrificial nanosheet layers 112, 114, 116, 118 and Si nanosheet layers 122, 124, 126.

As best shown in FIG. 1C, transistor isolation is provided by forming shallow trench isolation (STI) regions 140 between the elongated fin-shaped columns 130. In embodiments of the invention, the STI regions 140 can be formed by depositing bulk dielectric material between the elongated fin-shaped columns 130 and recessing the bulk dielectric to the desired level.

As best shown in FIGS. 1A and 1B, known semiconductor fabrication operations have been used to form a dummy dielectric/oxide 152 and a dummy gate 150 that extend over and around each of the elongated fin-shaped columns 130. The dummy gate 150 can be formed by depositing amorphous silicon (a-Si) over and around the elongated fin-shaped columns 130. The a-Si is then planarized to a desired level. A hard mask layer (not shown) is deposited over the planarized a-Si and patterned to form the hard mask 154. In embodiments of the invention, the hard mask 154 can be formed from a nitride or an oxide layer. An etching process (e.g., an RIE) is applied to the a-Si to form the dummy gate 150.

As best shown in FIG. 1A, known semiconductor fabrication operations have been used to form offset gate spacers 160 along sidewalls of the dummy gate 160. The offset gate spacers 160 can be formed using a spacer pull down formation process. The offset gate spacers 160 can also be formed by a conformal deposition of a dielectric material (e.g., silicon oxide, silicon nitride, silicon oxynitride, SiBCN, SiOCN, SiOC, or any suitable combination of those materials) followed by a directional etch (e.g., RIE).

At the fabrication stage shown in FIGS. 1A, 1B, and 1C, the elongated fin-shaped columns 130 include exposed portions (outside the dummy gate 150 and offset gate spacers 160) having lateral sidewalls having a length (L) and end sidewalls having a width (W). As best shown in FIGS. 1A and 1B, L is greater than W.

Figure 2A:
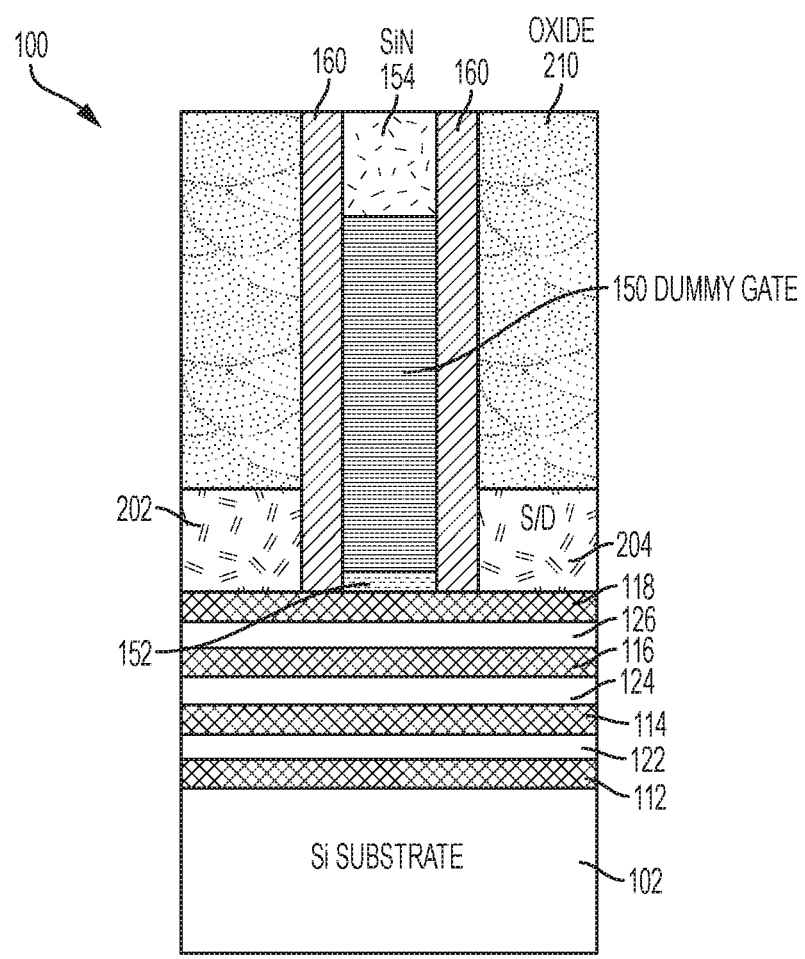
FIG. 2A depicts a cross-sectional view of a semiconductor structure after a fabrication stage according to embodiments of the present invention.
Figure 2B:
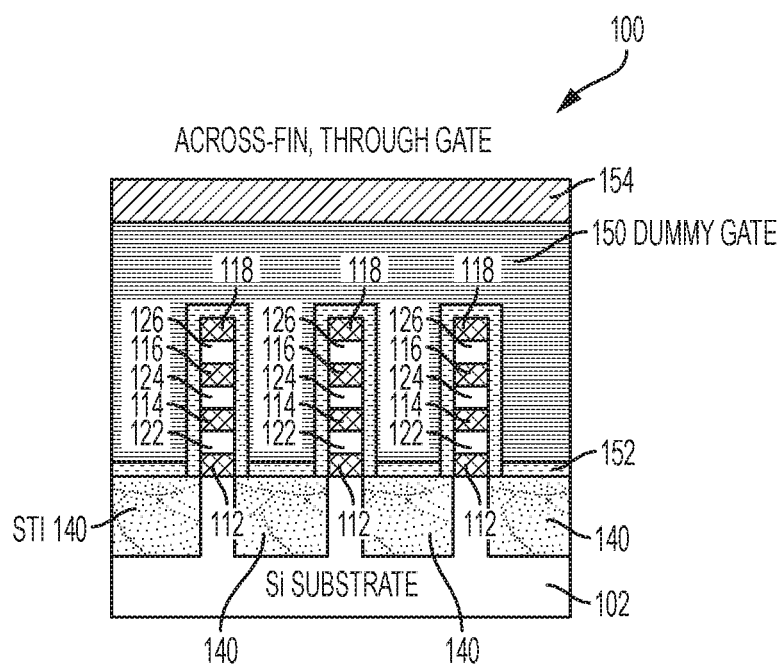
FIG. 2B depicts a cross-sectional view of the semiconductor structure shown in FIG. 2A, wherein the cross-sectional view is taken through a vertical plane extending through the gate structure region shown in FIG. 2A and rotated clockwise by 90 degrees.
Figure 2C:
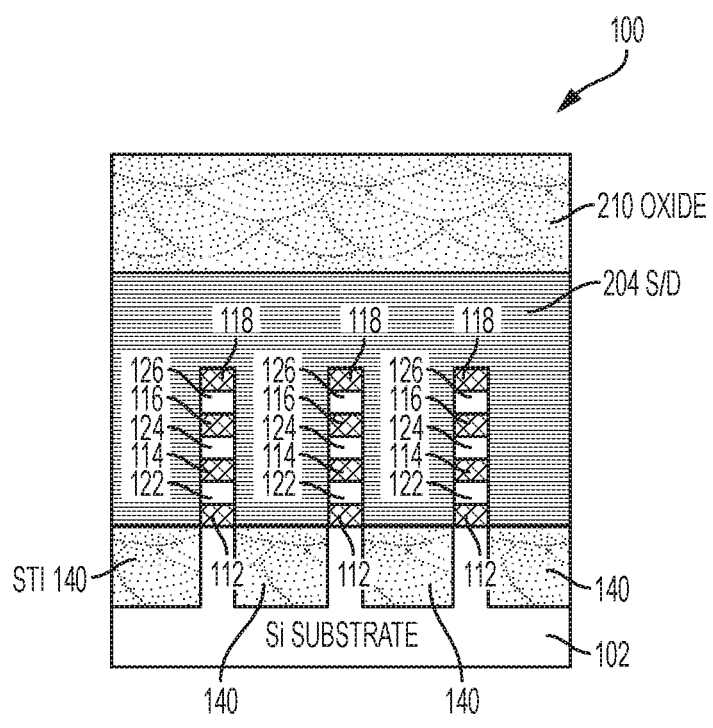
FIG. 2C depicts a cross-sectional view of the semiconductor structure shown in FIG. 2A, wherein the cross-sectional view is taken through a vertical plane extending through a S/D region of the semiconductor structure shown in FIG. 2A and rotated counterclockwise by 90 degrees.

As best shown in FIGS. 2A, 2B and 2C, known semiconductor device fabrication processes have been used to form raised source/drain (S/D) regions 202, 204. In known nanosheet fabrication processes, the elongated fin-shaped columns 130 are chopped into smaller fin-shaped columns in order to form inner spacers at the end regions of the SiGe sacrificial nanosheets prior to forming the raised S/D regions. This known procedure for forming the inner spacers leaves only a limited cross-section surface at the ends of the chopped Si channel nanosheets from which to epitaxially grow the S/D regions. The quality of an epitaxial growth is related to the surface area from which the epitaxial growth occurs. Because known nanosheet fabrication processes leave only limited single crystalline surface areas available for epitaxially growing the S/D regions, it can be difficult to form high quality epitaxially grown S/D regions using known nanosheet fabrication methods.

Contrary to known nanosheet fabrication methods, in embodiments of the invention, $GeO_2$ is used to form self-aligned inner spacers 602 (shown in FIG. 6A) without the need to cut the elongated fin-shaped columns 130. Because the elongated fin-shaped columns 130 provide substantially more exposed Si channel surface area than known nanosheet FET fabrication operations, in embodiments of the invention, high quality, low contact resistance S/D regions 202, 204 can be epitaxially grown from the exposed portions of the uncut elongated fin-shaped columns 130. In embodiments of the invention, the raised S/D regions 202, 204 are formed using an epitaxial layer growth process on the exposed surfaces of the SiGe dummy/sacrificial nanosheet layers 112, 114, 116, 118 and the Si nanosheet layers 122, 124, 126. In-situ doping (ISD) is applied to form doped S/D regions 202, 204, thereby creating the necessary junctions of the final nanosheet FET device. Virtually all semiconductor transistors are based on the formation of junctions. Junctions are capable of both blocking current and allowing it to flow, depending on an applied bias. Junctions are typically formed by placing two semiconductor regions with opposite polarities into contact with one another. The most common junction is the p-n junction, which consists of a contact between a p-type piece of silicon, rich in holes, and an n-type piece of silicon, rich in electrons. N-type and p-type FETs are formed by implanting different types of dopants to selected regions of the device to form the necessary junction(s). N-type devices can be formed by implanting arsenic (As) or phosphorous (P), and p-type devices can be formed by implanting boron (B).

As best shown in FIG. 2A, known semiconductor fabrication operations have been used to form an oxide, which functions as an interlayer dielectric (ILD) region 210. The ILD region 210 can be formed by depositing an oxide material in bulk (e.g., silicon dioxide) and polishing the bulk oxide back (e.g., using CMP) to the level of the gate spacers 160 and the hard mask 154.

As best shown in FIGS. 3A and 3B, the dummy gate 150 and the hard mask 154 have been removed. The dummy gate 150 and the hard mask 154 can be removed by a known etching process, e.g., one or more of a dry etch process (e.g., a reactive ion etch (RIE), plasma etching, or the like) and a wet etch process using phosphoric acid ($H_3PO_4$).

Figure 4B:
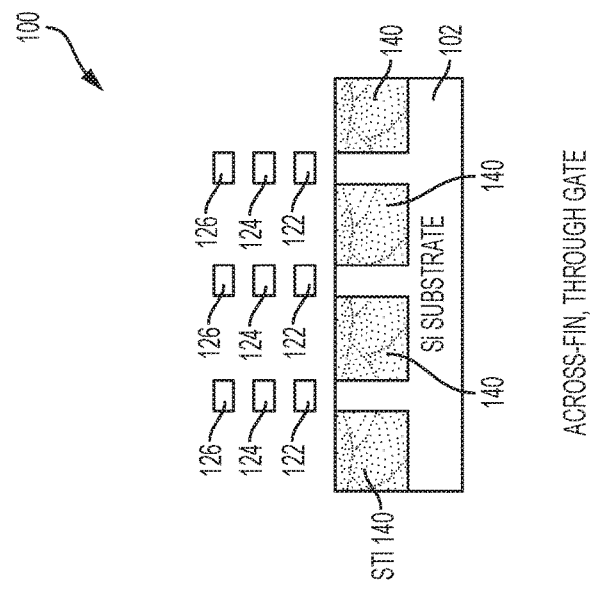
FIG. 4B depicts a cross-sectional view of the semiconductor structure shown in FIG. 4A, wherein the cross-sectional view is taken through a vertical plane extending through the gate structure region shown in FIG. 4A and rotated clockwise by 90 degrees.
Figure 4A:
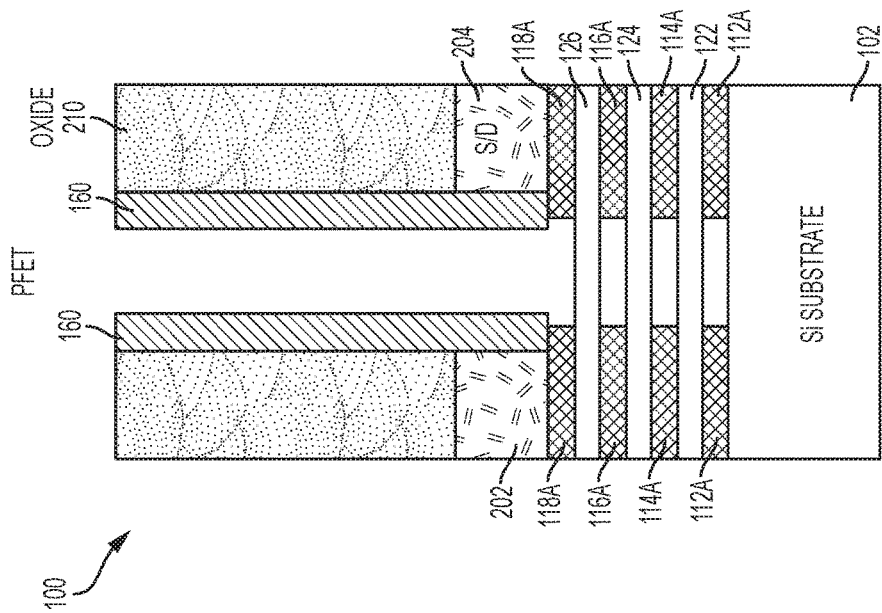
FIG. 4A depicts a cross-sectional view of a semiconductor structure after a fabrication stage according to embodiments of the present invention.

As best shown in FIG. 4A, known semiconductor fabrication operations have been used to strip the dummy oxide 152 and remove central regions of the SiGe sacrificial nanosheets 112, 114, 116, 118, thereby leaving the SiGe sacrificial nanosheet end regions 112A, 114A, 116A, 118A. In embodiments of the invention, central regions of the SiGe sacrificial nanosheets 112, 114, 116, 118 can be removed by applying a selective etch (e.g., a hydrochloric acid (HCl)) such that the remaining SiGe sacrificial nanosheet end regions 112A, 114A, 116A, 118A undercut the offset gate spacers 160 by a predetermined amount.

Figure 5B:
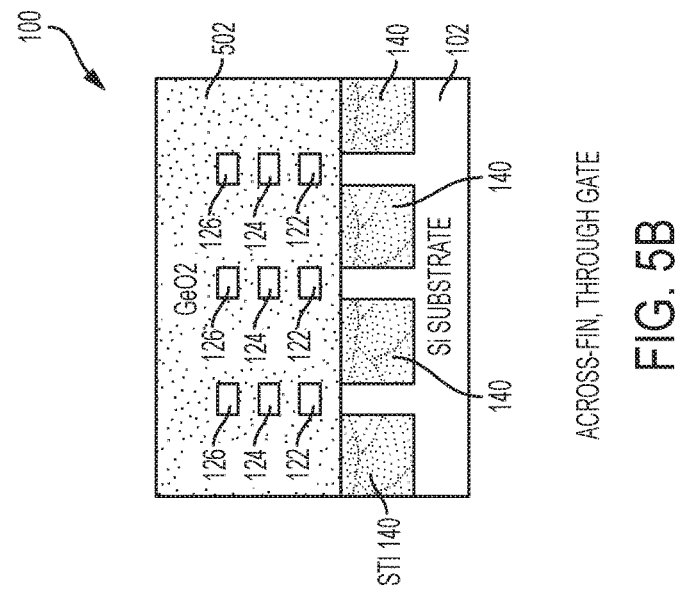
FIG. 5B depicts a cross-sectional view of the semiconductor structure shown in FIG. 5A, wherein the cross-sectional view is taken through a vertical plane extending through the gate structure region shown in FIG. 5A and rotated clockwise by 90 degrees.
Figure 5A:
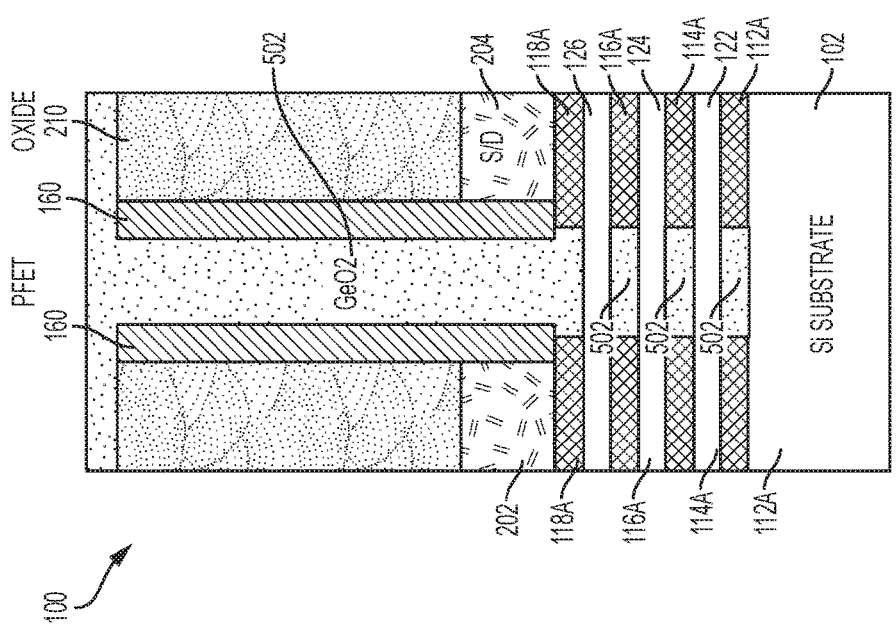
FIG. 5A depicts a cross-sectional view of a semiconductor structure after a fabrication stage according to embodiments of the present invention.

FIGS. 5A-7 depict a process, in accordance with embodiments of the invention, for using $GeO_2$ to form self-aligned inner spacers 602 (shown in FIG. 6A) without the need to cut the elongated fin-shaped columns 130. As best shown in FIGS. 5A and 5B, an oxide of Ge (e.g., $GeO_2$) is formed in the space that was occupied by the dummy gate 150 (shown in FIG. 2A), the dummy oxide 152 (shown in FIG. 3A), the hard mask 154 (shown in FIG. 2A), and the central regions of the SiGe sacrificial nanosheets 112, 114, 116, 118 (shown in FIG. 3A).

As best shown in FIG. 6A, at least one low temperature, oxygen-free anneal operation has been applied to the semiconductor device structure 100 shown in FIGS. 5A and 5B, wherein the at least one anneal operation is sufficient to result in the $GeO_2$ 502 and the SiGe sacrificial nanosheet end regions 112A, 114A, 116A, 118A interacting to convert portions of the $GeO_2$ to $SiO_2$ to thereby form the inner spacers 602. In some embodiments of the invention, the at least one anneal operation includes a first anneal at a first predetermined temperature (e.g., a spike anneal at about 500 degrees Celsius) in an $N_2$ ambient. In embodiments of the invention, the at least one anneal operation further includes a second anneal at a second predetermined temperature (e.g., about 450 degrees Celsius), wherein the second predetermined temperature is less than the first predetermined temperature.

In embodiments of the invention, the above-described at least one anneal is in an inert gas ambient. The $GeO_2$ 502 will react with the SiGe sacrificial nanosheet end regions 112A, 114A, 116A, 118A, thus leading to a condensation of germanium and converting the upper sacrificial portion from SiGe to the higher Ge concentration SiGe, thereby forming a gradient Ge concentration (in the range of about 10% to about 40%) in the SiGe sacrificial nanosheet end regions 112A, 114A, 116A, 118A. At the same time, $GeO_2$ 502 converts to $SiO_2$ 602 after the chemical reactions such that Si in the SiGe sacrificial nanosheet end regions 112A, 114A, 116A, 118A are selectively oxidized due to the lower Gibbs free energy.

In embodiments of the invention, the above-described inner spacer formation process can be well-controlled, as the reaction of GeO₂ with the SiGe in the sacrificial nanosheet end regions 112A, 114A, 116A, 118A only occurs during the anneal, which can, in some embodiments be a spike anneal at a temperature of about 500 degrees Celsius. At these temperatures, there is no reaction of GeO₂ with pure silicon. Accordingly, the annealing method of the present invention is highly selective to SiGe. During the novel inner spacer formation process, the reaction of GeO₂ with SiGe in the sacrificial nanosheet end regions 112A, 114A, 116A, 118A selectively oxidizes silicon in the exposed SiGe sacrificial nanosheet end regions 112A, 114A, 116A, 118A and condenses germanium in the oxide layer according to the reaction described in FIG. 7. As the reaction proceeds, more Si in the SiGe sacrificial nanosheet end regions 112A, 114A, 116A, 118A is oxidized to SiO₂, and the surfaces of the SiGe sacrificial nanosheet end regions 112A, 114A, 116A, 118A are continuously enriched with more germanium.

The selective SiO₂ formation in this manner is self-limited and will continue until either all of the GeO₂ is consumed or the SiGe surface becomes sufficiently enriched with germanium that the reaction cannot proceed. In the Si-limited scenario (e.g., a relatively thick GeO₂ region is deposited), the reaction will stop when available silicon atoms are not enough at the SiGe surface. Consequently, the severity of the inner spacer formation process can be tuned by adjusting the thickness of the GeO₂ 502 that undercuts the offset gate spacers 160, or by adjusting the anneal temperature/duration.

Figure 7:
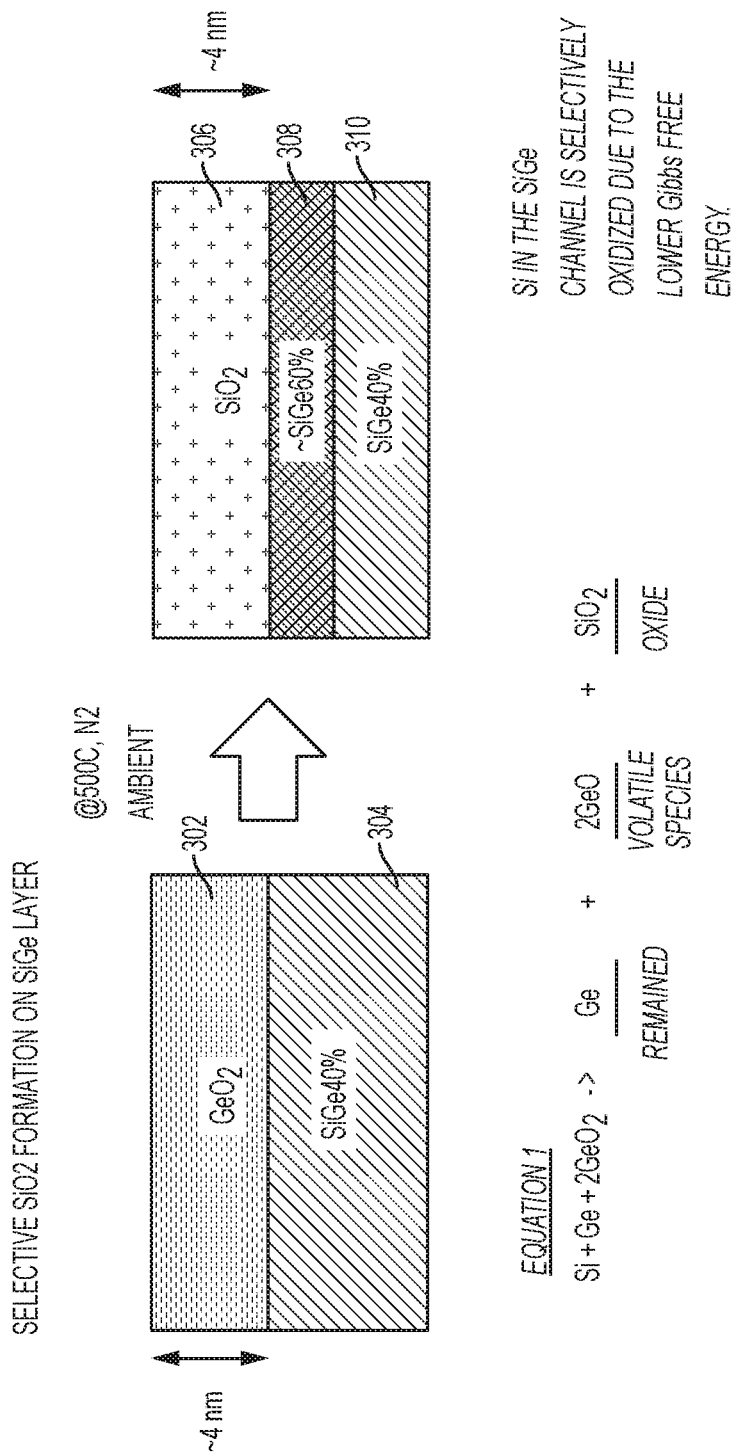

FIG. 7 depicts a diagram illustrating the selective formation of a silicon dioxide layer from an anneal-driven reaction between germanium dioxide and silicon germanium, which is described in the immediately preceding paragraph, and which is in accordance with embodiments of the invention. As shown in FIG. 7, the pre-anneal structure is a GeO₂ layer 302 over a SiGe 40% layer 304, and the post-anneal structure is a SiO₂ layer 306 formed over a SiGe 60% layer 308 and a SiGe 40% layer 310. The anneal reaction proceeds according to Equation 1 shown in FIG. 3. The GeO₂ layer 302 will react with the SiGe 40% layer 304, thus leading to a condensation of germanium and converting the GeO₂ layer 302 to SiO₂, thereby forming the SiO₂ layer 306. During the novel central isolation region formation process, the reaction of GeO₂ with SiGe 40% layer 304 selectively oxidizes silicon in the SiGe 40% layer, thus leading to a condensation of germanium at the surface and converting the GeO₂ layer 302 to SiO₂ layer 306. As the reaction proceeds the ratio of the SiGe layer 310 to the SiGe layer 308 continues to increase until a desired ratio is reached.

In FIGS. 8A and 8B, after completion of the reactions to form the self-aligned inner spacers 602, the unreacted portions of GeO₂ 502 have been removed. The GeO₂ 502 can be removed by exposing it to a water containing wash because GeO₂ is water soluble.

In FIGS. 9A and 9B, known semiconductor fabrication processes (e.g., a gate-late fabrication process) have been used to replace the removed GeO₂ 502 with a multi-segmented metal gate structure 902 that includes replacement metal gate elements and gate dielectric layers (not shown separately). The gate dielectric material can be silicon oxide, silicon nitride, silicon oxynitride, boron nitride, SiOCN, SiBCN, SiOC, SiCN, high-k materials, or any combination of these materials. Examples of high-k materials include but are not limited to metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k material can further include dopants such as lanthanum, aluminum, magnesium. The gate dielectric can be deposited by CVD, ALD, or any other suitable technique. In embodiments of the invention, the replacement metal gate structure 902 can include workfunction metal (WFM) layers, (e.g., titanium nitride, titanium aluminum nitride, titanium aluminum carbide, titanium aluminum carbon nitride, and tantalum nitride) and other appropriate metals and conducting metal layers (e.g., tungsten, cobalt, tantalum, aluminum, ruthenium, copper, metal carbides, and metal nitrides). The multi-segmented metal gate structure 902 (including the high-k dielectric layer) surround the stacked Si nanosheet channel regions 122, 124, 126 and regulate electron flow through the Si nanosheet channel regions 122, 124, 126 between the source 202 and the drain 204.

The methods described herein are used in the fabrication of IC chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Various embodiments of the present invention are described herein with reference to the related drawings. Alternative embodiments can be devised without departing from the scope of this invention. Although various connections and positional relationships (e.g., over, below, adjacent, etc.) are set forth between elements in the detailed description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Similarly, the term "coupled" and variations thereof describes having a communications path between two elements and does not imply a direct connection between the elements with no intervening elements/connections between them. All of these variations are considered a part of the specification. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

Spatially relative terms, e.g., "beneath," "below," "lower," "above," "upper," and the like, can be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device can be otherwise oriented (rotated 90 degrees or at other orientations) and the spatially relative descriptors used herein interpreted accordingly.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The phrase "selective to," such as, for example, "a first element selective to a second element," means that the first element can be etched and the second element can act as an etch stop.

The term "conformal" (e.g., a conformal layer) means that the thickness of the layer is substantially the same on all surfaces, or that the thickness variation is less than 15% of the nominal thickness of the layer.

As previously noted herein, for the sake of brevity, conventional techniques related to semiconductor device and integrated circuit (IC) fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), chemical-mechanical planarization (CMP), and the like. Reactive ion etching (RIE), for example, is a type of dry etching that uses chemically reactive plasma to remove a material, such as a masked pattern of semiconductor material, by exposing the material to a bombardment of ions that dislodge portions of the material from the exposed surface. The plasma is typically generated under low pressure (vacuum) by an electromagnetic field. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The flowchart and block diagrams in the Figures illustrate possible implementations of fabrication and/or operation methods according to various embodiments of the present invention. Various functions/operations of the method are represented in the flow diagram by blocks. In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A method of fabricating a semiconductor device, the method comprising:
    performing fabrication operations to form a nanosheet field effect transistor device, wherein the fabrication operations include:
        forming a stack over a substrate;
        wherein the stack comprises alternating layers of sacrificial nanosheets and channel nanosheets over the substrate;
        wherein the stack further comprises lateral sidewalls having a length (L) and end sidewalls having a width (W);
        wherein L is greater than W;
        forming source or drain (S/D) regions along the length (L) of the lateral sidewalls; and
        forming a cavity in portions of the sacrificial nanosheet, wherein the sacrificial nanosheet comprises a first type of semiconductor material and a second type of semiconductor material.

2. The method of claim 1, wherein forming the S/D regions comprises epitaxially growing the source and drain regions.

3. The method of claim 2, wherein the lateral sidewalls comprise a portion of the channel nanosheet.

4. The method of claim 3, wherein a seed material for the epitaxial growth of the S/D regions comprises the portion of the lateral sidewalls that comprise the channel nanosheet.

5. The method of claim 4, wherein the channel nanosheet comprises single crystalline silicon.

6. The method of claim 5, wherein the stack comprises an elongated, fin-shaped structure.

7. The method of claim 1 further comprising forming a dummy gate structure over and around a portion of the stack.

8. The method of claim 7 further comprising:
    removing portions of the sacrificial nanosheets from portions of the stack that are under the dummy gate;
    removing the dummy gate; and
    forming a replacement metal gate structure in spaces that were occupied by the dummy gate and the portions of the sacrificial nanosheets that were under the dummy gate.

9. The method of claim 1 further comprising depositing an oxide of the second type of semiconductor material in the cavity to form an interface between the sacrificial nanosheet and the oxide of the second type of semiconductor material.

10. The method of claim 9 further comprising performing at least one anneal operation on the interface sufficient to result in the sacrificial nanosheet layer and the oxide of the second type of semiconductor material interacting to convert at least a portion of the oxide of the second type of semiconductor material to an oxide of the first type of semiconductor material.

11. The method of claim 10, wherein the at least one anneal operation comprises a first anneal at a first predetermined temperature.

12. The method of claim 11, wherein:
    the first type of semiconductor material comprises silicon; and
    the second type of semiconductor material comprises germanium.

13. A method of fabricating a semiconductor device, the method comprising:
    performing fabrication operations to form a nanosheet field effect transistor device, wherein the fabrication operations include:
        forming a stack over a substrate;
        wherein the stack comprises alternating layers of sacrificial nanosheets and channel nanosheets over the substrate;
        wherein the stack comprises lateral sidewalls having a length (L) and end sidewalls having a width (W);
        wherein L is greater than W;
        forming, using an epitaxial growth process, source or drain (S/D) regions along the length (L) of the lateral sidewalls; and
        forming inner spacers by performing a chemical reaction that comprises converting an oxide of a second type of semiconductor material to an oxide of a first type of semiconductor material;
        wherein forming the inner spacers further comprises forming a cavity in portions of the sacrificial nanosheet; and
        wherein the sacrificial nanosheet comprises the first type of semiconductor material and the second type of semiconductor material.

14. The method of claim 13 further comprising depositing the oxide of the second type of semiconductor material in the cavity to form an interface between the sacrificial nanosheet and the oxide of the second type of semiconductor material.

15. The method of claim 14, wherein:
    performing the chemical reaction further comprises performing at least one anneal operation on the interface sufficient to result in the sacrificial nanosheet layer and the oxide of the second type of semiconductor material interacting to convert at least a portion of the oxide of the second type of semiconductor material to the oxide of the first type of semiconductor material; and the at least one anneal operation comprises a first anneal at a first predetermined temperature.

16. The method of claim 15, wherein:

the first type of semiconductor material comprises silicon; and the second type of semiconductor material comprises germanium.

17. A nanosheet field effect transistor device comprising:

a stack formed over a substrate;

wherein the stack comprises alternating layers of sacrificial nanosheets and channel nanosheets over the substrate;

wherein the stack comprises lateral sidewalls having a length (L) and end sidewalls having a width (W);

wherein L is greater than W;

source or drain (S/D) regions epitaxially grown along the length (L) of the lateral sidewalls; and inner spacers formed adjacent portions of the sacrificial nanosheet layers;

wherein the sacrificial nanosheet comprises a first type of semiconductor material and a second type of semiconductor material; and wherein the inner spacers comprise an oxide of the first type of semiconductor material, wherein the oxide of the first type of material comprises a result from a chemical reaction between an oxide of the second type of semiconductor material and the sacrificial inner spacers.

18. The device of claim 17, wherein:

the first type of semiconductor material comprises silicon; and the second type of semiconductor material comprises germanium.

* * * * *